(12) United States Patent
Ahn et al.

(10) Patent No.: US 7,776,635 B2
(45) Date of Patent: Aug. 17, 2010

(54) ARRAY SUBSTRATE FOR IN-PLANE SWITCHING LIQUID CRYSTAL DISPLAY DEVICE AND METHOD OF FABRICATING THE SAME

(75) Inventors: Ji-Young Ahn, Annyang-si (KR); Jae-Young Oh, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 289 days.

(21) Appl. No.: 11/391,512

(22) Filed: Mar. 29, 2006

(65) Prior Publication Data

US 2006/0220018 A1 Oct. 5, 2006

(30) Foreign Application Priority Data

Mar. 31, 2005 (KR) ............ 10-2005-0027064

(51) Int. Cl.
*H01L 21/00* (2006.01)
(52) U.S. Cl. .................. 438/34; 349/110
(58) Field of Classification Search .......... 438/34, 438/35, 30; 349/110, 111
See application file for complete search history.

(56) References Cited

U.S. PATENT DOCUMENTS

| | | | |
|---|---|---|---|
| 5,703,668 A * | 12/1997 | Shin | 349/110 |
| 6,563,554 B2 * | 5/2003 | Okamoto et al. | 349/12 |
| 6,836,299 B2 * | 12/2004 | Chung et al. | 349/42 |
| 7,129,637 B2 * | 10/2006 | Nakayama | 313/506 |
| 2005/0200791 A1 * | 9/2005 | Ahn | 349/141 |
| 2005/0239273 A1 * | 10/2005 | Yang | 438/601 |
| 2006/0046361 A1 * | 3/2006 | Song et al. | 438/151 |

FOREIGN PATENT DOCUMENTS

| | | |
|---|---|---|
| JP | 05-017882 | 1/1993 |
| JP | 11-024095 | 1/1999 |
| JP | 2001-250958 | 9/2001 |
| JP | 2002-062542 | 2/2002 |
| JP | 2002-368011 | 12/2002 |
| JP | 2003-021825 | 1/2003 |
| JP | 2004-325953 | 11/2004 |
| KR | 2002-0036401 | 5/2002 |

\* cited by examiner

*Primary Examiner*—N Drew Richards
*Assistant Examiner*—Grant S Withers
(74) *Attorney, Agent, or Firm*—McKenna Long & Aldridge LLP

(57) ABSTRACT

A fabricating method of an array substrate for an in-plane switching liquid crystal display device includes: forming a gate line and a common line on a substrate, the common line spaced apart from the gate line; forming a data line crossing the gate line to define a pixel region; forming a thin film transistor connected to the gate line and the data line; forming a pixel electrode and a common electrode in the pixel region, each of the pixel electrode and the common electrode including an opaque metal layer; and irradiating ultraviolet rays onto the opaque metal layer to form a metal oxide layer on the opaque metal layer.

8 Claims, 20 Drawing Sheets

US 7,776,635 B2

ARRAY SUBSTRATE FOR IN-PLANE SWITCHING LIQUID CRYSTAL DISPLAY DEVICE AND METHOD OF FABRICATING THE SAME

The application claims the benefit of Korean Patent Application No. 2005-0027064, filed on Mar. 31, 2005, which is hereby incorporated by reference for all purposes as if fully set forth herein.

BACKGROUND OF THE INVENTION

1. Field of the Invention

The present invention relates to a liquid crystal display (LCD) device. More particularly, the present invention relates to an array substrate for an in-plane switching liquid crystal display (IPS-LCD) device and a method of fabricating the same.

2. Discussion of the Related Art

Liquid crystal display (LCD) devices use the optical anisotropy and polarization properties of liquid crystal molecules to produce an image. The liquid crystal molecules have long, thin, shapes, and have an initial alignment direction including initial pretilt angles. The alignment direction can be controlled by applying an electric field to influence the alignment of the liquid crystal molecules. Due to an optical anisotropy property of liquid crystal, the refraction of incident light depends on the alignment direction of the liquid crystal molecules . . . Thus, by properly controlling the applied electric field, an image having a desired brightness can be produced.

Among the known types of liquid crystal displays (LCDs), active matrix LCDs (AM-LCDs), which have thin film transistors (TFTs) and pixel electrodes arranged in a matrix form, are the subject of significant research and development because of their high resolution and superior ability in displaying moving images.

Liquid crystal display (LCD) devices include two substrates spaced apart and facing each other, and a liquid crystal layer interposed between the two substrates. In one type of LCD device, each of the substrates includes an electrode with the electrodes of each substrate facing each other. A voltage is applied to each electrode inducing an electric field between the electrodes. The arrangement of the liquid crystal molecules is changed by varying the intensity of the electric field.

Because the electrodes are positioned respectively on each of the two opposing substrates, the electric field induced between the electrodes is perpendicular to the two substrates. Accordingly, LCD devices of this type have a narrow viewing angle because of the vertical electric field.

In order to solve the problem of narrow viewing angle, in-plane switching liquid crystal display (IPS-LCD) devices have been proposed. An IPS-LCD device includes a pixel electrode and a common electrode on the same substrate.

FIG. 1 is a cross-sectional view illustrating an IPS-LCD device according to the related art. The IPS-LCD device includes an array substrate and a color filter substrate with a liquid crystal layer interposed therebetween.

More particularly, as shown in FIG. 1, a pixel region "P" is defined on a first substrate 50. A thin film transistor "T" is formed in the pixel region "P" on the first substrate 50 for use as a switching element. Common electrodes 58 and pixel electrodes 72 are also formed in the pixel region "P". The thin film transistor "T" includes a gate electrode 52, a semiconductor layer 62, a source electrode 64, and a drain electrode 66. The common electrodes 58 alternate with and are parallel to the pixel electrodes 72 on the first substrate 50. The common electrode 58 is formed of the same material and on the same layer as the source and drain electrodes 64 and 66. The pixel electrode 72 is formed of a transparent conductive material. In addition, a common line connected to the common electrodes 58 is formed on the first substrate 50.

A second substrate 30 is spaced apart from the first substrate 50. A black matrix 32 is formed on an inner surface of the second substrate 30 facing the first substrate 50. The black matrix 32 on the second substrate 30 corresponds to the thin film transistor "T," the gate line and the data line on the first substrate 50. A color filter layer 34 including three color filters of red 34a, green 34b, and blue (not shown) is formed on the black matrix 32. The color filter layer 34 corresponds to the pixel region "P" on the first substrate 50.

A liquid crystal layer "LC" is interposed between the first substrate 50 and the second substrate 30. The alignment of the liquid crystal layer "LC" is controlled by a horizontal electric field 95 induced between the common electrode 58 and the pixel electrode 72.

FIG. 2 is a plan view illustrating an array substrate for an in-plane switching liquid crystal display (IPS-LCD) device according to the related art. The array substrate of FIG. 2 includes a common electrode and a pixel electrode formed of a transparent conductive material.

In FIG. 2, a gate line 54 and a data line 68 are formed on a substrate 50. The gate line 54 and the data line 68 cross each other to define a pixel region "P." A common line 56 is spaced apart from and parallel to the gate line 54. A thin film transistor "T" is formed at a crossing portion of the gate line 54 and the data line 68. The thin film transistor "T" includes a gate electrode 52, a semiconductor layer 62 on the gate electrode 52, a source electrode 64 and a drain electrode 66. The gate electrode 52 is connected to the gate line 54 and the source electrode 64 is connected to the data line 68.

Common electrodes 90 and pixel electrodes 92, which are parallel to and spaced apart from each other, are formed in the pixel region "P.". The common electrodes 90 contact the common line 56 and extend into the pixel region "P.". The pixel electrodes 92 contact the drain electrode 66 and extend into the pixel region "P."

When one of the common electrodes 90 and the pixel electrodes 92 is formed of a transparent conductive material, the IPS-LCD device may exhibit image deterioration effects such as stains.

FIGS. 3A and 3B are cross-sectional views, which are taken along a line "III-III" of FIG. 2, showing an exposure step for forming common electrodes and pixel electrodes of an array substrate for an in-plane switching liquid crystal display (IPS-LCD) device according to the related art. As shown in FIG. 3A, a gate insulating layer "GL" is formed on a substrate 50 and a data line 68 is formed on the gate insulating layer "GL.". In addition, a passivation layer "PL" is formed on the data line 68 and a transparent conductive material layer 96 is formed on an entire surface of the passivation layer "PL.", A photoresist (PR) layer 98 is formed on the transparent conductive material layer 96. A mask "M" having a transmissive portion "F1" and a blocking portion "F2" is disposed over the PR layer 98. The mask "M" is aligned with the substrate 50 such that the blocking portion "F2" corresponds to common electrodes and pixel electrodes.

The substrate 50 is disposed on a chuck "CK" of an exposure apparatus and light "L" is irradiated onto the PR layer 98 through the mask "M." Since the chuck "CK" is formed of a metallic material, a part of the light "L" passing through the mask "M," the PR layer 98, the transparent conductive material layer 96, the passivation layer "PL" and the gate insulating layer "GL" is reflected by the chuck "CK." The part of the light "L" reflecting from the chuck "CK" is irradiated onto the PR layer 98 corresponding to the blocking portion "F2" of the mask "M.". The undesired irradiation of the PR layer 98 due to reflection from the chuck "CK" creates non-uniformities in PR patterns.

As shown in FIG. 3B, after the light "L" (of FIG. 3A) is irradiated, the PR layer 98 (of FIG. 3A) is developed to form a PR pattern (not shown). The transparent conductive material layer 96 (of FIG. 3A) is etched using the PR pattern as an etch mask to form common electrodes 90 and pixel electrodes 92. Since the intensity of light irradiated onto the PR layer 98 (of FIG. 3A) corresponding to a portion "K" over the chuck "CK" (of FIG. 3A) is higher than the intensity of light irradiated onto other portions of the PR layer 98 (of FIG. 3A), a first width "d1" of the common electrodes 90 and the pixel electrodes 92 corresponding to the portion "K" is smaller than a second width "d2" of the common electrodes 90 and the pixel electrodes 98 corresponding to other portions. The difference in widths "d1" and "d2" is a critical dimension (CD) deviation of the PR pattern. The CD deviations result in brightness differences in the LCD device that are recognized as stains by LCD device users. Stains caused by chuck reflection may be referred to as chuck stains.

FIG. 4 is a cross-sectional view showing common electrodes and pixel electrodes of an array substrate for another related art in-plane switching liquid crystal display (IPS-LCD) device. In FIG. 4, common electrodes 90 are formed of an opaque material and pixel electrodes 92 are formed of a transparent material. Even though no CD deviation is created corresponding to the opaque common electrodes 90, the transparent pixel electrodes 92 have a CD deviation such that a first width "d1" of the pixel electrodes 92 corresponding to a portion "K" over a chuck is smaller than a second width "d2" of the pixel electrodes 98 corresponding to the other portion.

The common electrodes 90 are simultaneously formed with a gate line (not shown) and a gate electrode. The gate line is formed of a material having a relatively great thickness providing a corresponding relatively low resistivity to prevent a signal delay. Because the common electrodes 90 are created simultaneously with the gate line, the common electrodes 90 also have a relatively great thickness causing a height or step difference in the upper layers formed over the common electrodes 90. When the common electrodes 90 and the pixel electrodes 92 are formed of a transparent material, the step difference causes an observable image imperfection or step stain in the LCD device.

Furthermore, the transparent conductive material has a higher resistivity than the opaque metallic material. Accordingly, in a large size LCD device, the resistivity of a transparent conductive material may cause problems such as a signal delay, and may reduce design freedom when creating large sized LCD devices having pixel electrodes and common electrodes of a transparent conductive material.

SUMMARY OF THE INVENTION

Accordingly, the present invention is directed to an array substrate for an in-plane switching liquid crystal display device and method of fabricating the same that substantially obviates one or more problems due to limitations and disadvantages of the related art.

An advantage of the present invention is to provide an in-plane switching liquid crystal display device where chuck stains and step stains are prevented.

Another advantage of the present invention is to provide an in-plane switching liquid crystal display device where a resistance of pixel electrodes and common electrodes is reduced.

Another advantage of the present invention is to provide an in-plane switching liquid crystal display device that has pixel electrodes and common electrodes of multiple layers including an opaque material.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabricating method of an array substrate for an in-plane switching liquid crystal display device includes: forming a gate line and a common line on a substrate, the common line spaced apart from the gate line; forming a data line crossing the gate line to define a pixel region; forming a thin film transistor connected to the gate line and the data line; forming a pixel electrode and a common electrode in the pixel region, each of the pixel electrode and the common electrode including an opaque metal layer; and irradiating ultraviolet (UV) rays onto the opaque metal layer to form a metal oxide layer on the opaque metal layer.

In another aspect, an array substrate for an in-plane switching liquid crystal display device includes: a gate line on a substrate; a data line crossing the gate line to define a pixel region; a common line spaced apart from the gate line; a thin film transistor connected to the gate line and the data line; and a pixel electrode and a common electrode in the pixel region, each of the pixel electrode and the common electrode including a transparent conductive layer, an opaque metal layer on the transparent conductive layer and a metal oxide layer on the opaque metal layer.

A fabricating method of an array substrate for an in-plane switching liquid crystal display device includes: forming a gate line and a common line on a substrate, the common line spaced apart from the gate line; forming a data line crossing the gate line to define a pixel region; forming a thin film transistor connected to the gate line and the data line; forming a pixel electrode and a common electrode in the pixel region, each of the pixel electrode and the common electrode including a transparent conductive layer and an opaque metal layer on the transparent conductive layer; and irradiating ultraviolet rays onto the opaque metal layer to form a metal oxide layer on the opaque metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, an example of which is illustrated in the accompanying drawings.

Figure 1:
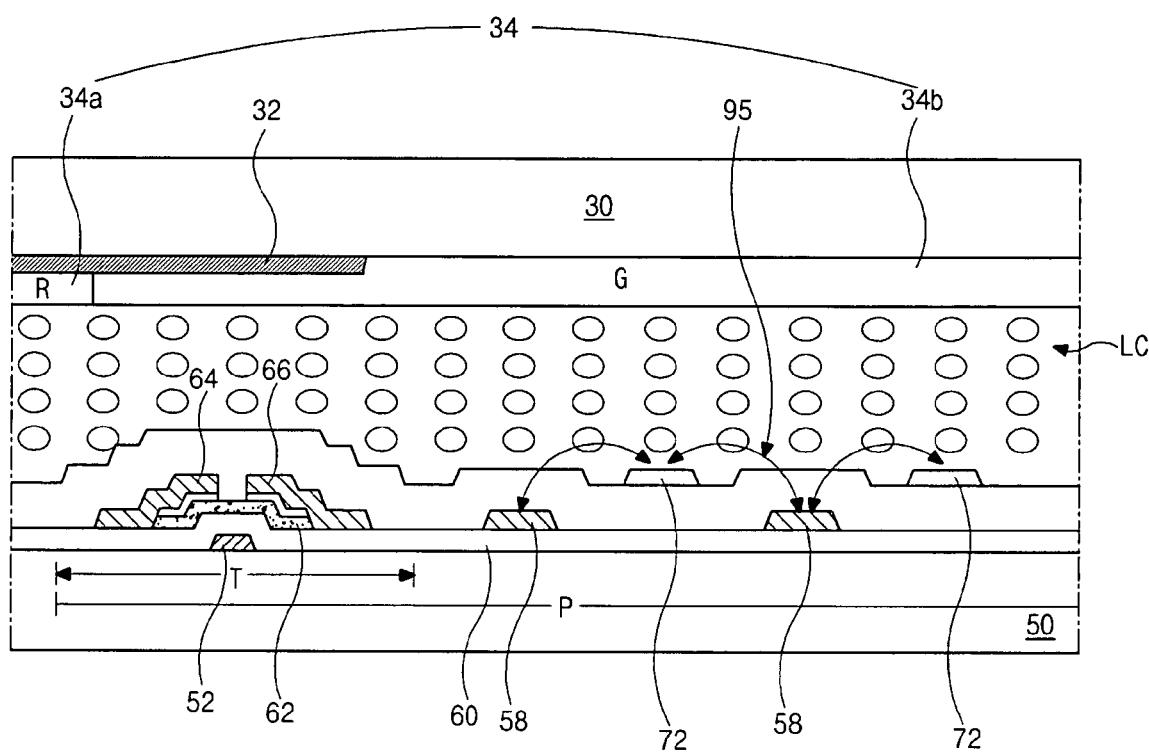
FIG. 1 is a cross-sectional view illustrating an in-plane switching liquid crystal display (IPS-LCD) device according to the related art.
Figure 2:
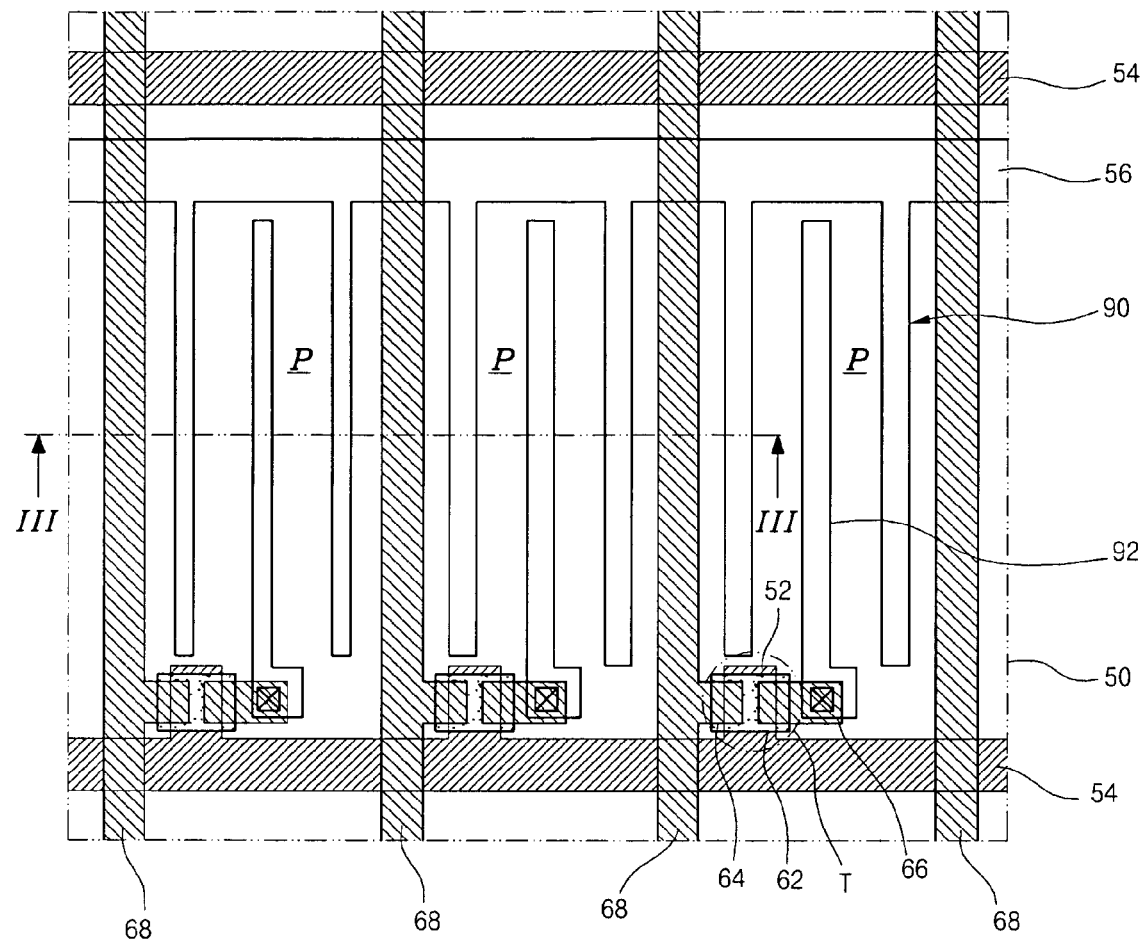
FIG. 2 is a plan view illustrating an array substrate for an in-plane switching liquid crystal display (IPS-LCD) device according to the related art.
Figure 3A:
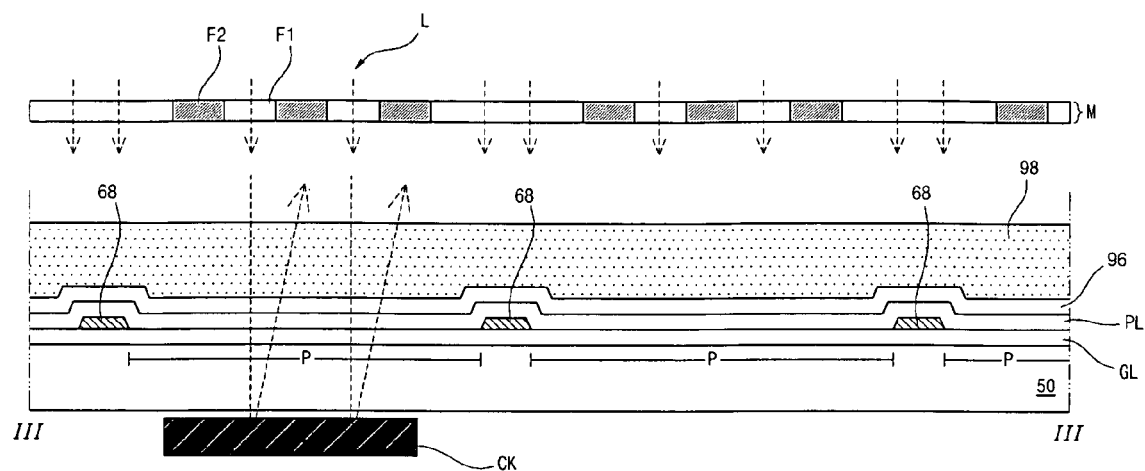
FIGS. 3A and 3B are cross-sectional views, which are taken along a line "III-III" of FIG. 2, showing an exposure step for forming common electrodes and pixel electrodes of an array substrate for an in-plane switching liquid crystal display (IPS-LCD) device according to the related art.
Figure 3B:
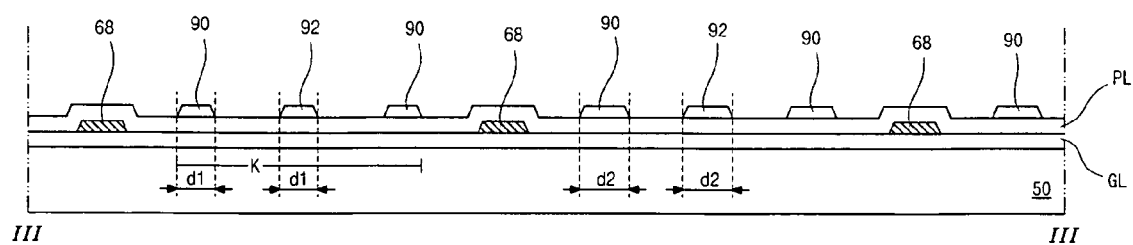
Figure 4:
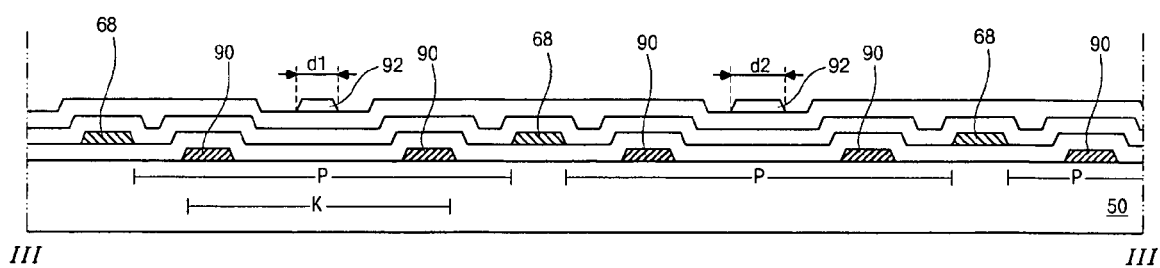
FIG. 4 is a cross-sectional view showing common electrodes and pixel electrodes of an array substrate for an in-plane switching liquid crystal display (IPS-LCD) device according to another related art.
Figure 5:
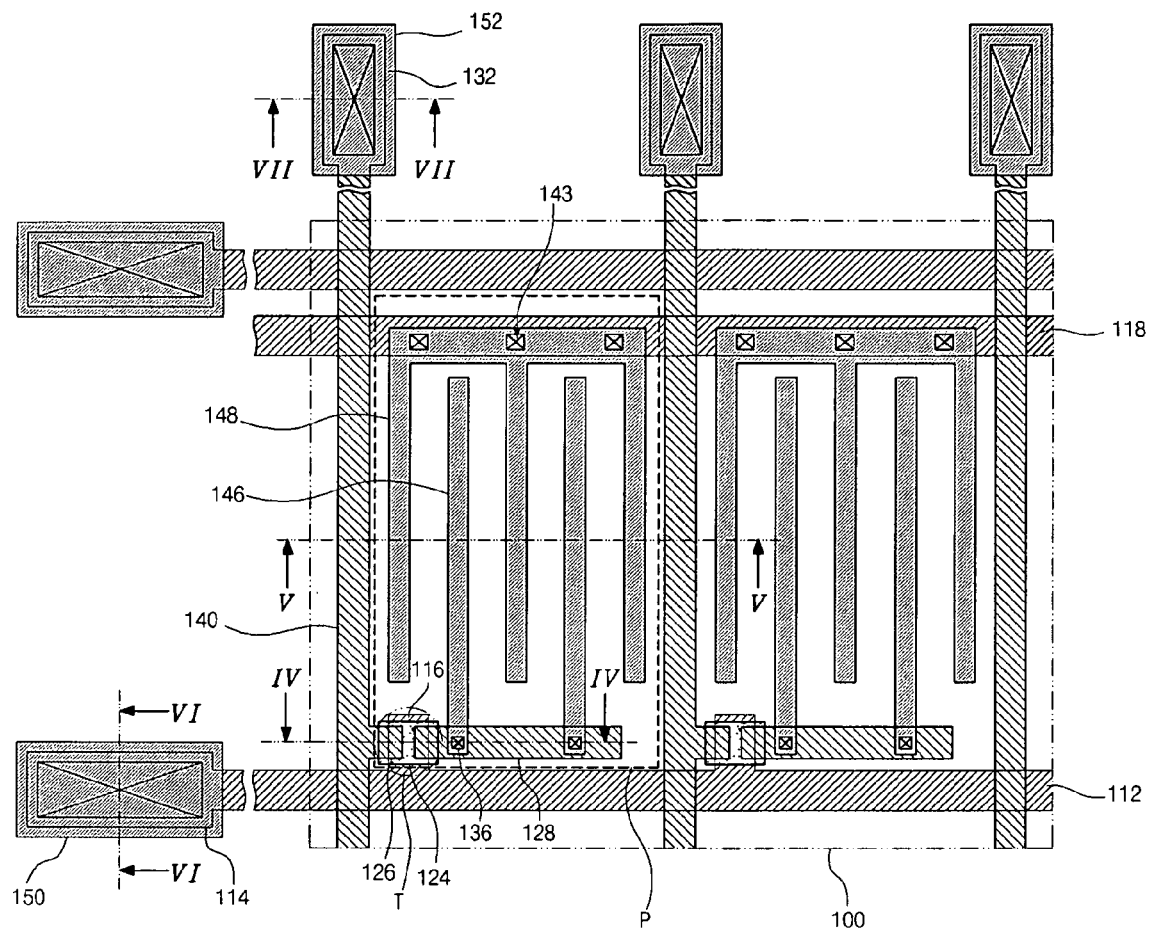
FIG. 5 is a plan view illustrating an array substrate for an in-plane switching liquid crystal display (IPS-LCD) device according to a first embodiment of the present invention.
Figure 6A:
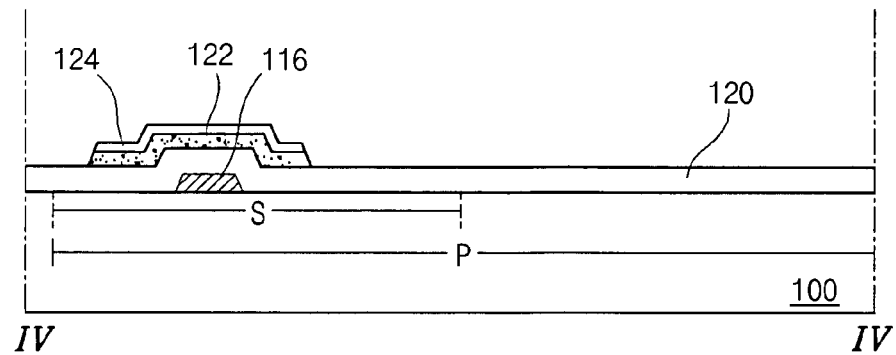
FIGS. 6 (6A to 6D), 7 (7A to 7D), 8 (8A to 8D), 9 (9A to 9D), and 10 (10A to 10D) are cross-sectional views showing a fabricating method of an in-plane switching liquid crystal display device according to a first embodiment of the present invention.
Figure 6B:
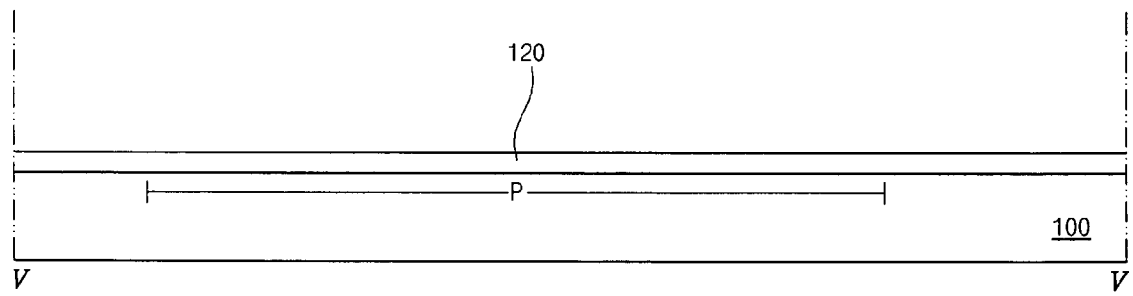
Figure 6C:
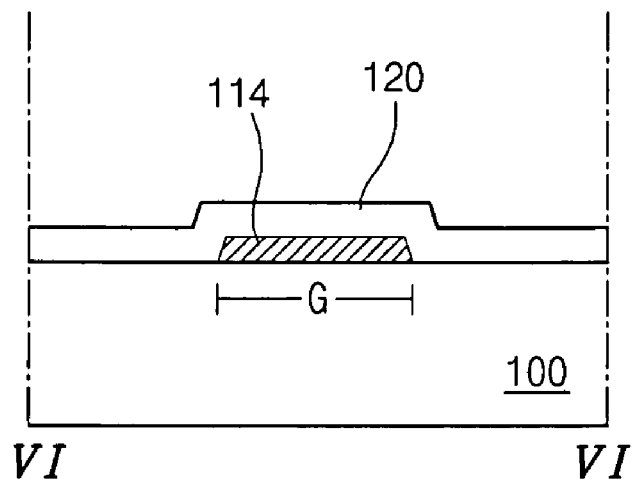
Figure 6D:
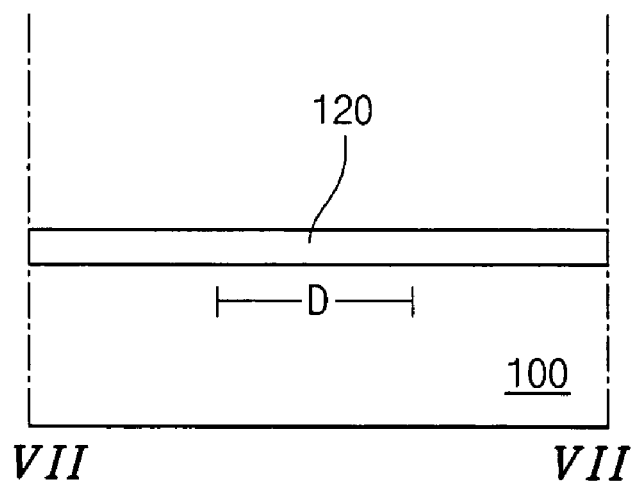
Figure 7A:
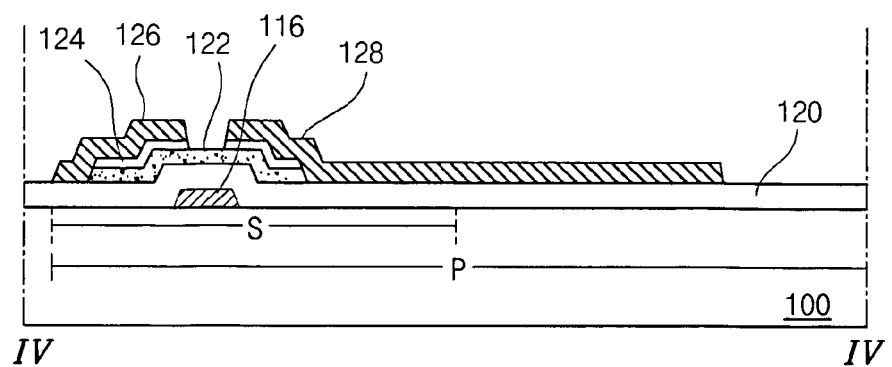
Figure 7B:
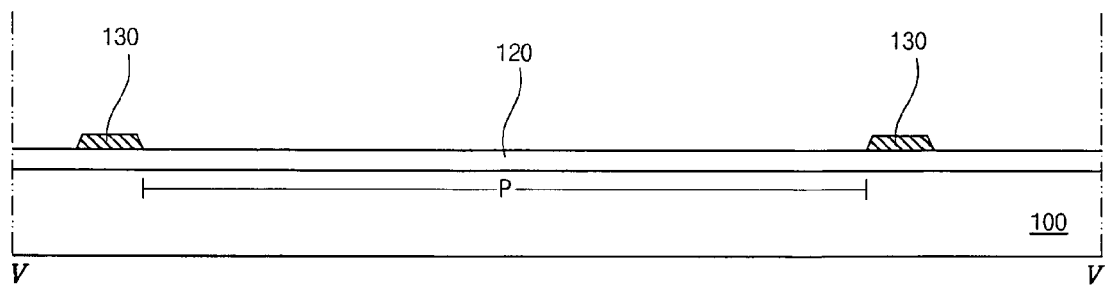
Figure 7C:
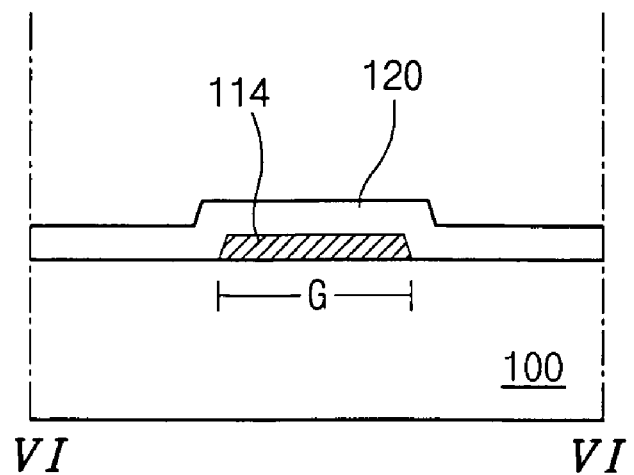
Figure 7D:
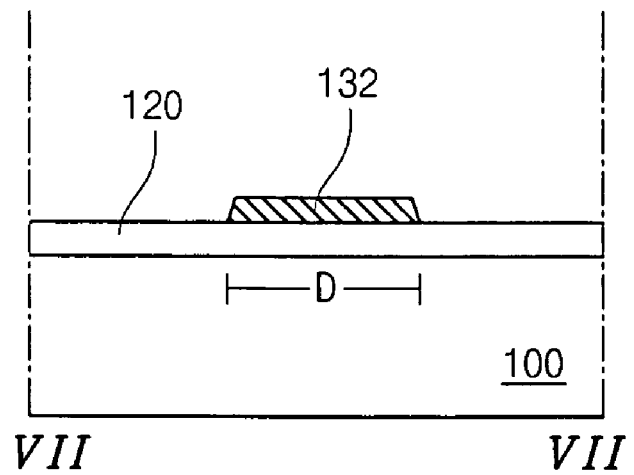
Figure 8A:
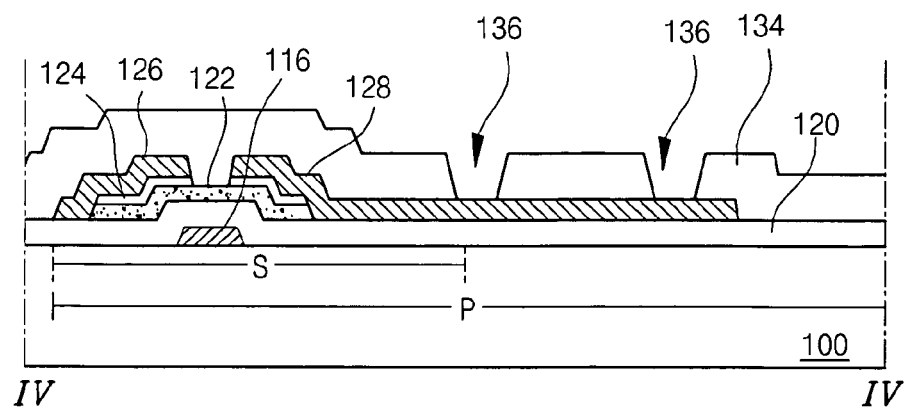
Figure 8B:
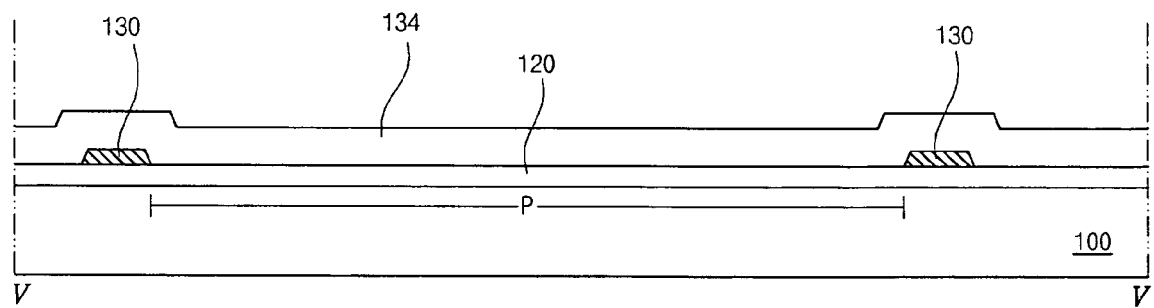
Figure 8C:
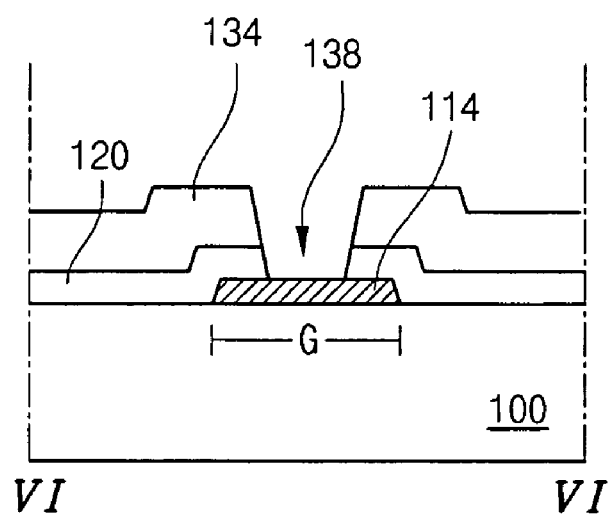
Figure 8D:
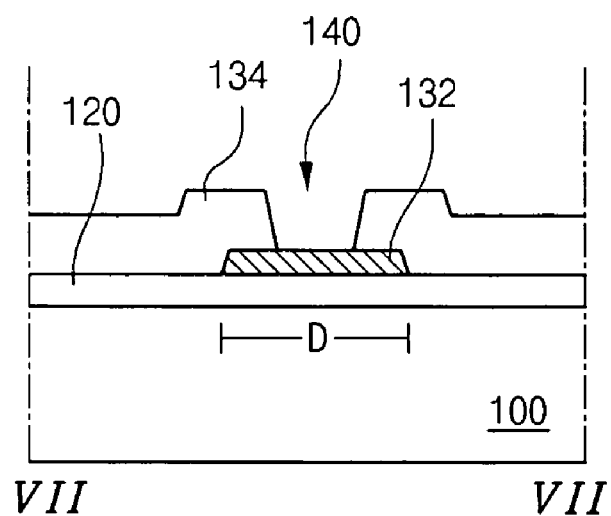
Figure 9A:
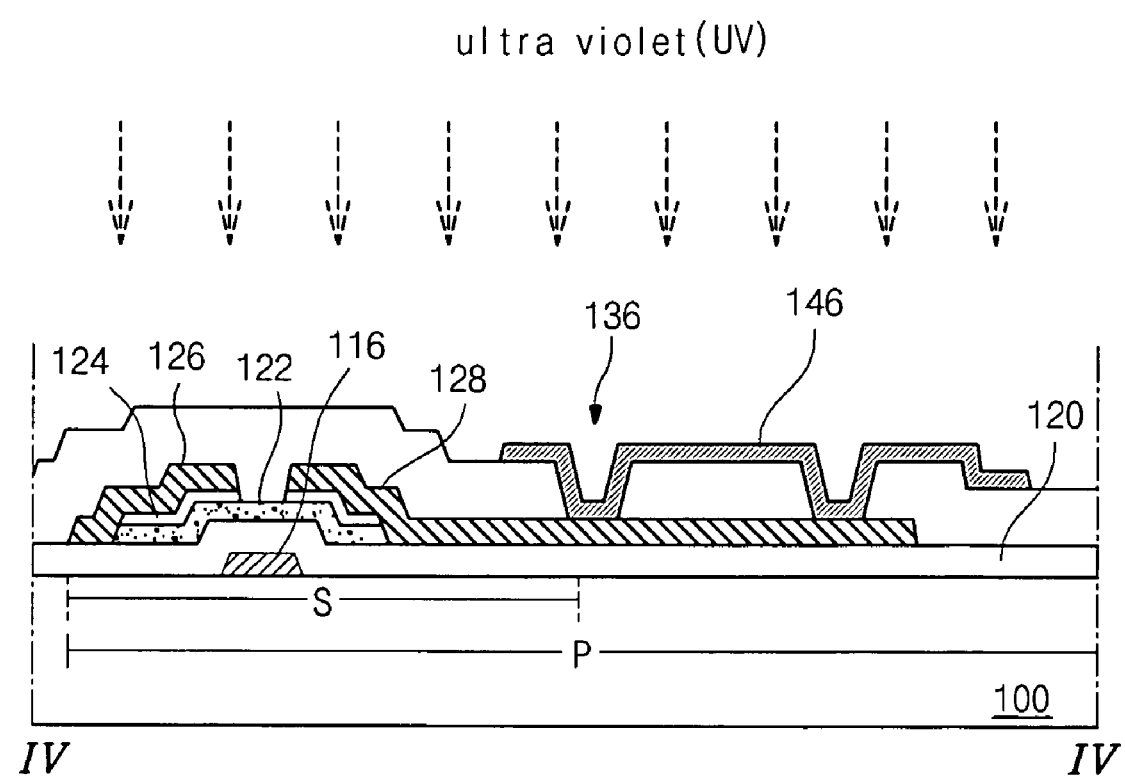
Figure 9B:
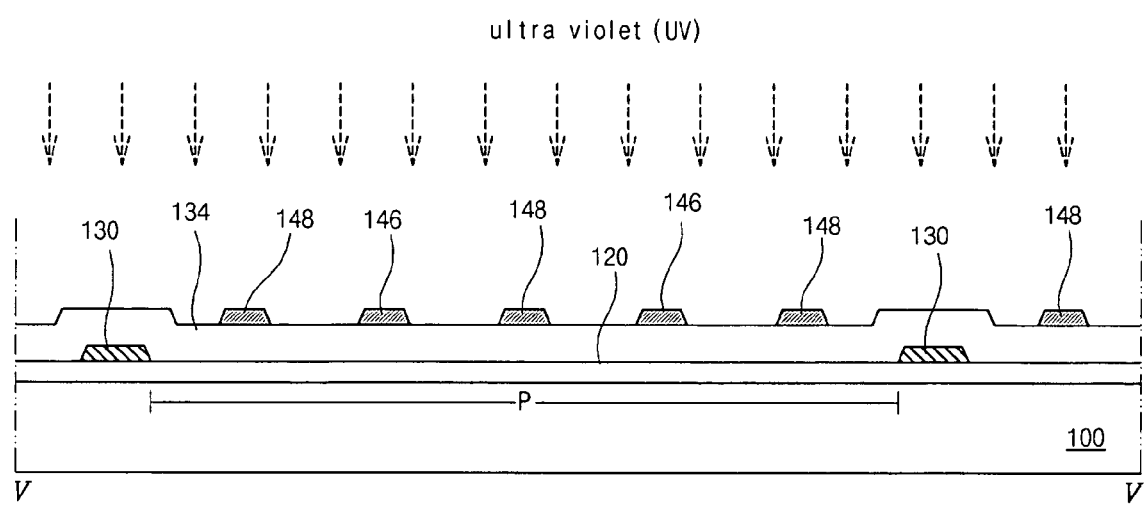
Figure 9C:
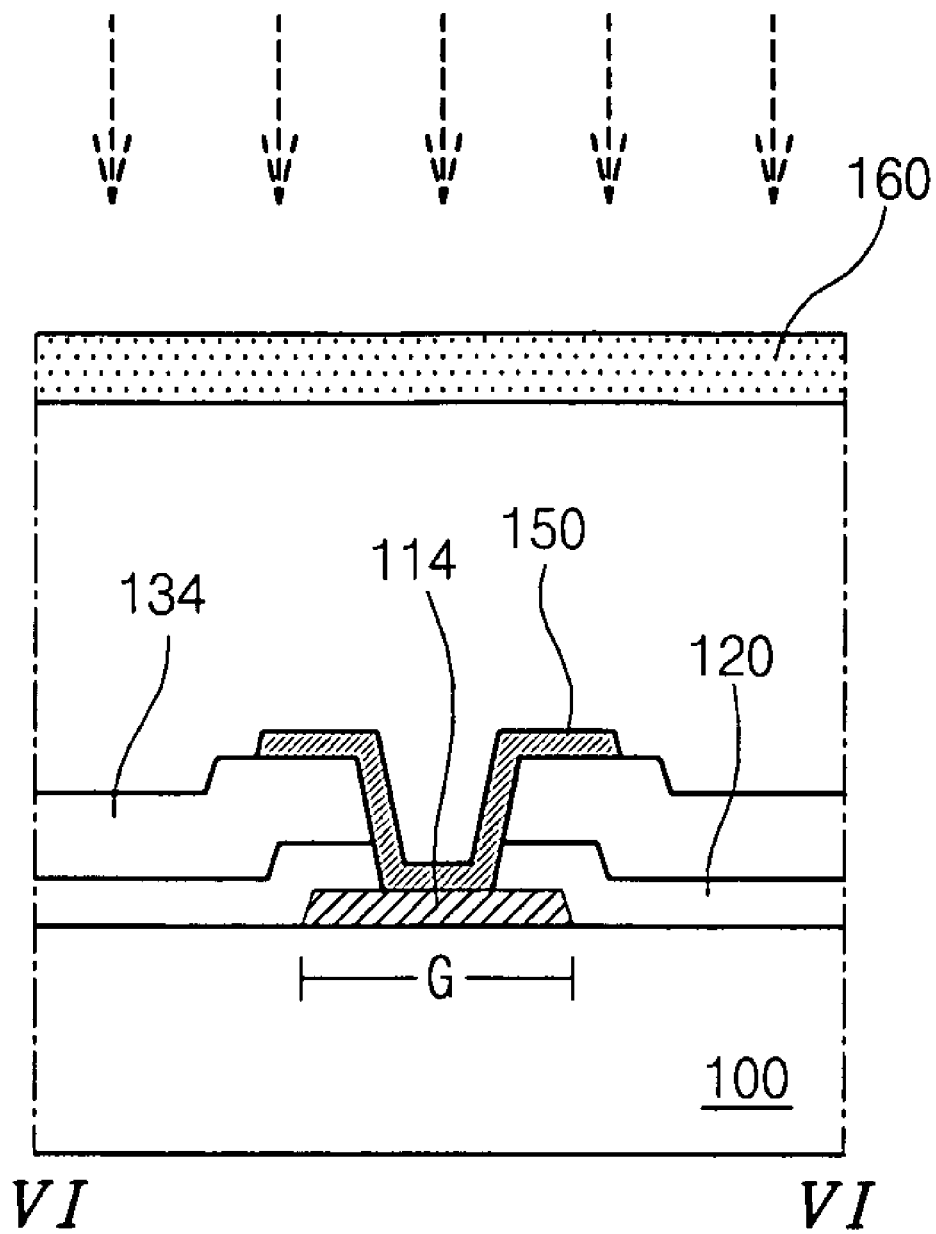
Figure 9D:
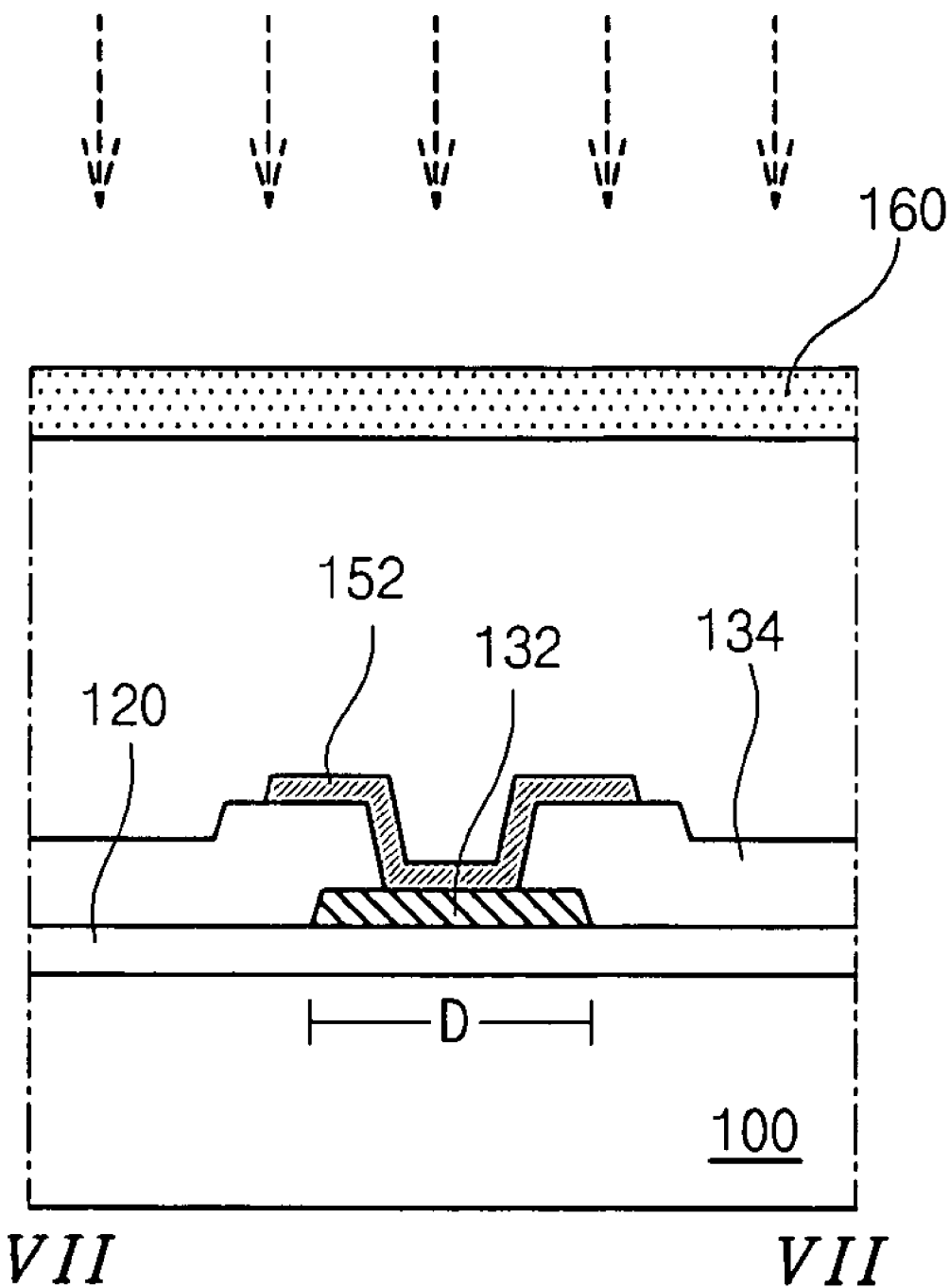
Figure 10A:
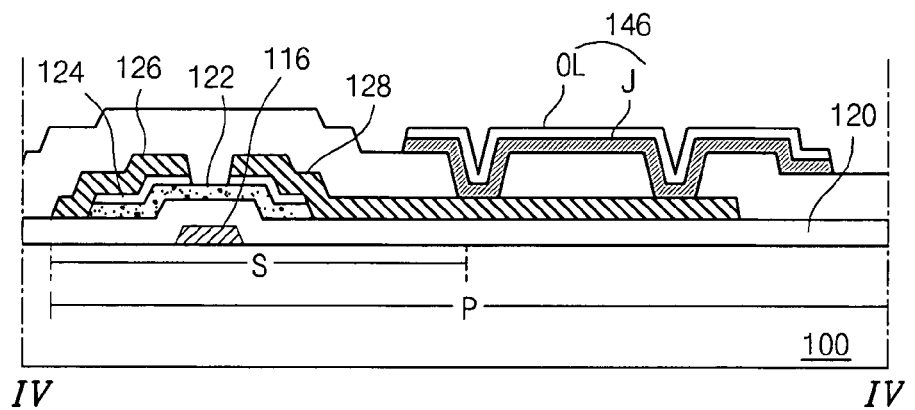
Figure 10B:
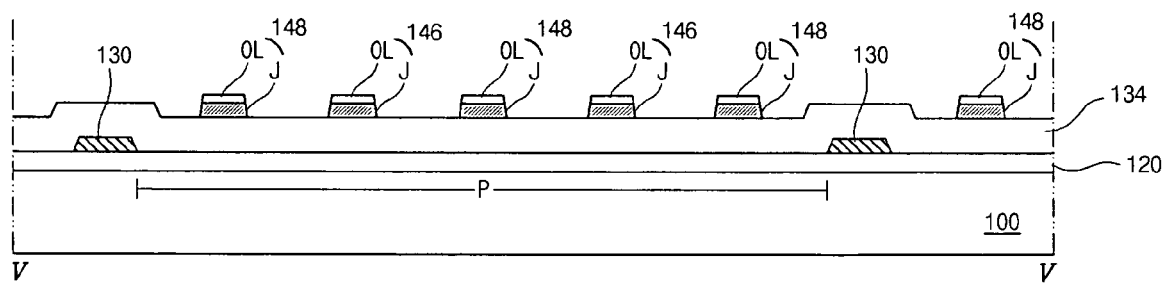
Figure 10C:
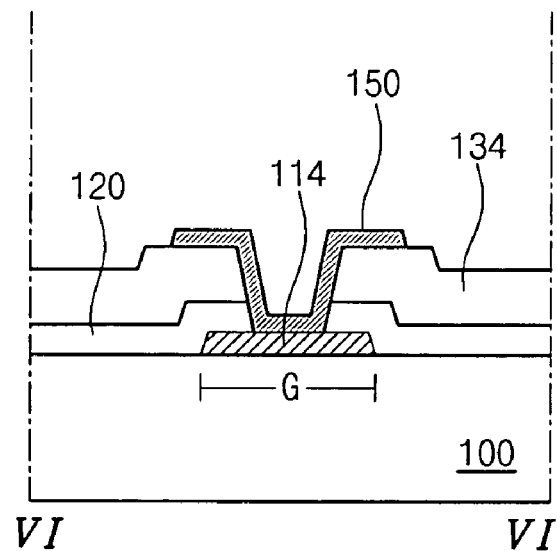
Figure 10D:
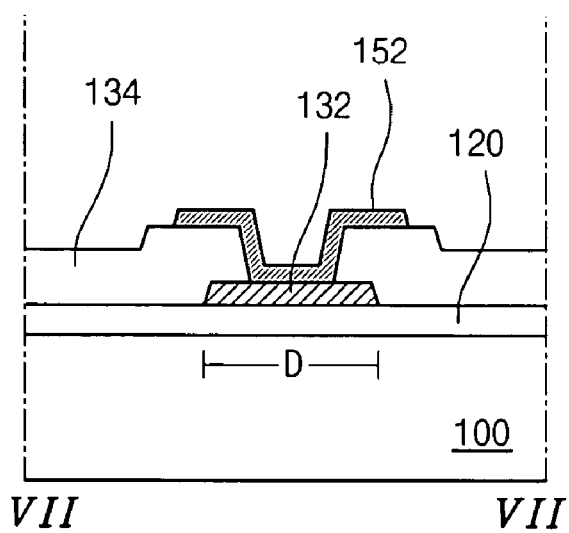

FIG. 5 is a plan view illustrating an array substrate for an in-plane switching liquid crystal display (IPS-LCD) device according to a first embodiment of the present invention.

In FIG. 5, a gate line 112, a gate pad 114 at one end of the gate line 112, a data line 140 and a data pad 132 at one end of the data line 140 are formed on a substrate 100. The gate line 112 crosses the data line 140 to define a pixel region "P.". A common line 118 is formed to be parallel and spaced apart from the gate line 112. A thin film transistor (TFT) "T" is formed at crossing of the gate line 112 and the data line 140. The TFT "T" includes a gate electrode 116 connected to the gate line 112, an active layer 124 over the gate electrode 116, a source electrode 126 connected to the data line 140 and a drain electrode 128 spaced apart from the source electrode 126. The source and drain electrodes 126 and 128 are formed over the active layer 124. Pixel electrodes 146 and common electrodes 148 having a bar shape are formed in the pixel region "P.". The pixel electrodes 146 and the common electrodes 148 are parallel to and spaced apart from one another. The pixel electrodes 146 are connected to the drain electrode 128 through a drain contact hole 136, and the common electrodes 148 are connected to the common line 118 through a common contact hole 143. A data signal and a common signal are applied to the pixel electrodes 146 and the common electrodes 148, respectively. A gate pad terminal 150 is connected to the gate pad 114 via a contact hole. A data pad terminal 152 is connected to the data pad 132 via a contact hole.

Each of the pixel electrodes 146 and the common electrodes 148 includes an opaque metal layer and an oxide layer over the opaque metal layer. The opaque metal layer has a relatively low resistivity and a relatively low reflectance. In addition, the oxide layer may be formed by oxidization of a top surface of the opaque metal layer using infrared (IR) rays. Each of the gate pad terminal 150 and the data pad terminal 152 includes an opaque metal layer. Since the pixel electrodes 146 and the common electrodes 148 include an opaque metal layer, light does not pass through the opaque metal layer of these electrodes to reflect from the chuck of an exposure apparatus. Accordingly, a uniform critical dimension (CD) is obtained preventing the creation of a chuck stain. Further, since the pixel electrodes 146 and the common electrodes 148 include an opaque metal layer having a relatively low resistivity, operating characteristics of even large sized LCD devices are improved. Although the common line 118 is shown in FIG. 5 as being formed in a different layer from the common electrodes 148, the common line 118 may alternatively be formed in the same layer as the common electrodes 148.

FIGS. 6A to 6D, 7A to 7D, 8A to 8D, 9A to 9D, and 10A to 10D are cross-sectional views showing a fabricating method of an in-plane switching liquid crystal display device according to a first embodiment of the present invention. FIGS. 6A, 7A, 8A, 9A, and 10A are taken along a line "IV-IV," and FIGS. 6B, 7B, 8B, 9B, and 10B are taken along a line "V-V." In addition, FIGS. 6C, 7C, 8C, 9C, and 10C are taken along a line "VI-VI," and FIGS. 6D, 7D, 8D, 9D, and 10D are taken along a line "VII-VII."

As shown in FIGS. 6A to 6D, a substrate 100 includes: a pixel region "P" including a switch area "S"; a gate pad region "G"; and a data pad region "D.". A gate line 112, a gate pad 114 and a common line 118, (of FIG. 5) are formed on the substrate 100 by depositing and patterning a first conductive metallic material. The gate pad 114 is disposed in the gate pad area "G" at one end of the gate line 112, and the common line 118 (of FIG. 5) is disposed to be parallel to and spaced apart from the gate line 112. In addition, a gate electrode 116 extending from the gate line 112 is formed on the substrate 100. Alternatively, a portion of a gate line may be used as a gate electrode. The first conductive metallic material may include at least one of aluminum (Al), aluminum (Al) alloy, chromium (Cr), copper (Cu), titanium (Ti) and molybdenum (Mo). Further, the gate line 112 and the common line 118 (of FIG. 5) have one of a single layer, and a multiple layer including the first conductive metallic material.

A gate insulating layer 120 is formed on the gate line 112, the gate pad 114, the gate electrode 116 and the common line 118. The gate insulating layer 120 may include an inorganic insulating material such as silicon oxide ($SiO_2$) and silicon nitride (SiNx). Intrinsic amorphous silicon (a-Si:H) and impurity-doped amorphous silicon (n+a-Si:H) material are sequentially deposited on the gate insulating layer 120, and an active layer 122 and an ohmic contact layer 124 are formed on the gate insulating layer 120 over the gate electrode 116 in the switch area "S" by patterning the deposited intrinsic amorphous silicon (a-Si:H) and impurity-doped amorphous silicon (n+a-Si:H).

As shown in FIGS. 7A to 7D, a source electrode 126 and a drain electrode 128 is formed on the ohmic contact layer 124 by depositing and patterning a second conductive metallic material. The source and drain electrodes 126 and 128, are spaced apart from each other, and the drain electrode 126 extends into the pixel region "P.". A data line 130 connected to the source electrode 126 and a data pad 132 in the data pad area "D" at one end of the data line 130 are formed on the gate insulating layer 120 by patterning the second conductive material. The second conductive metallic material may include at least one of aluminum (Al), aluminum (Al) alloy such as aluminum neodymium (AlNd), chromium (Cr), tungsten (W), titanium (Ti), molybdenum (Mo) and molybdenum tungsten (MoW).

As shown in FIGS. 8A to 8D, a passivation layer 134 is formed on the source electrode 126, the drain electrode 128 and the data line 130. A drain contact hole 136 exposing the drain electrode 128, a gate pad contact hole 138 exposing the gate pad 114 and a data pad contact hole 140 exposing the data pad 132 formed are through the passivation layer 134. A common contact hole 143 (of FIG. 5) exposing the common line 118 (of FIG. 5) is formed through the passivation layer 134 and the gate insulating layer 120. The passivation layer may include an organic insulating material such as benzocyclobutene (BCB) or acrylic resin.

As shown in FIGS. 9A to 9D, pixel electrodes 146 and common electrodes 148 are formed on the passivation layer 134 in the pixel region "P" by depositing and patterning a third conductive metallic material. The pixel electrodes 146 are connected to the drain electrode 146 through the drain contact hole 136. The common electrodes 148 are connected to the common line 118 (of FIG. 5) through the common contact hole 143 (of FIG. 5) and are spaced apart form the pixel electrodes 146. A gate pad terminal 150 and a data pad terminal 152 are formed on the gate pad 114 and the data pad 132, respectively by patterning the third conductive material. The third conductive metallic material is opaque and has a relatively low resistivity. For example, the third conductive metallic material may include at least one of aluminum (Al), aluminum (Al) alloy such as aluminum neodymium (AlNd), chromium (Cr), copper (Cu), titanium (Ti) and molybdenum (Mo). In addition, when the pixel electrodes 146 and the common electrodes 148 have a single layer, the pixel electrodes 146 and the common electrodes 148 may have a thickness of about 100 Å to about 1000 Å.

A blocking means 160 such as a shadow mask is disposed over the gate pad terminal 150 and the data pad terminal 152, and ultraviolet (UV) rays are irradiated onto the pixel electrodes 146 and the common electrodes 148. The blocking means 160 shields the gate pad terminal 150 and the data pad terminal 152 so that UV rays are not irradiated onto the gate pad terminal 150 and the data pad terminal 152. Alternatively, a layer of a material absorbing UV rays may be formed on the gate pad terminal 150 and the data pad terminal 152 as the blocking means.

As illustrated in FIGS. 10A to 10D, a metal oxide layer "OL" is formed on a top surface of the pixel electrodes 146 and the common electrodes 148 through oxidation of the third conductive metallic material by the UV ray irradiation. Accordingly, each of the pixel electrodes 146 and the common electrodes 148 includes an opaque metal layer "J" and a metal oxide layer "OL" formed on the opaque metal layer "J.". When the third conductive metallic material includes titanium (Ti), the metal oxide layer "OL" may include titanium oxide (TiOx). More generally, the metal oxide layer "OL" includes a metal oxide corresponding to the third conductive metallic material. The opaque metal layer "J" has a relatively low resistivity and the metal oxide layer "OL" has a reflectance less than about 10%. In addition, a total thickness of the metal oxide layer "OL" and the opaque metal layer "J" is within a range of about 100 Å to about 2000 Å. As a result of the relatively small thicknesses of the pixel electrodes 146 and the common electrodes 148, a step difference in the upper layers due to the pixel electrodes 146 and the common electrodes 148 is reduced. Because the gate pad terminal 150 and the data pad terminal 152 are shielded from the UV rays by the blocking means 160, an oxide layer is not formed on the gate pad terminal 150 and the data pad terminal 152.

Figure 11A:
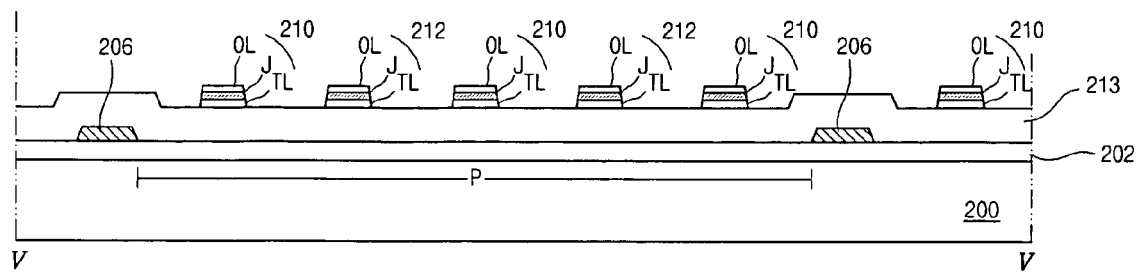
FIGS. 11A, 11B, and 11C are cross-sectional views showing an array substrate of an in-plane switching liquid crystal display device according to a second embodiment of the present invention.
Figure 11B:
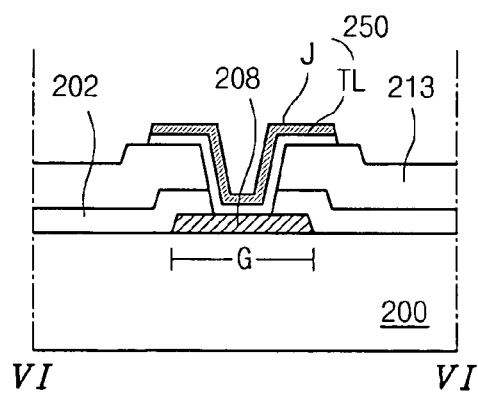
Figure 11C:
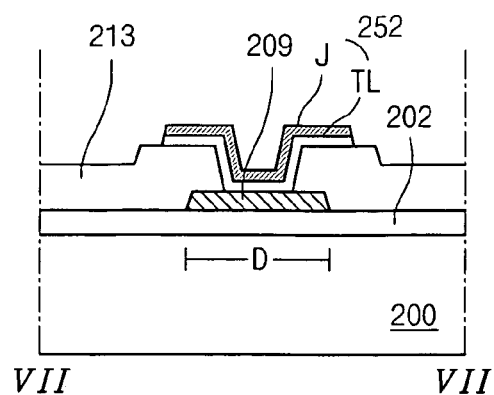

FIGS. 11A to 11C are cross-sectional views showing an array substrate of an in-plane switching liquid crystal display device according to a second embodiment of the present invention. FIGS. 11A, 11B and 11C correspond to cross-sections taken along lines "V-V," "VI-VI" and "VII-VII," respectively.

As may be appreciated by referring to FIGS. 11A to 11C, a gate line (not shown) and a gate pad 208 are formed on a substrate 200 that includes a pixel region "P," a gate pad region "G" and a data pad region "D." The gate pad 208 is disposed in the gate pad region "G" at one end of the gate line. A gate insulating layer 202 is formed on the gate line and the gate pad 208, and a data line 206 and a data pad 209 are formed on the gate insulating layer 202. The data pad 209 is disposed in the data pad region "D" at one end of the data line 206. A passivation layer 213 of an organic insulating material is formed on the data line 206 and the data pad 209. Pixel electrodes 212 and common electrodes 210 are formed on the passivation layer 213 in the pixel region "P.". Each of the pixel electrodes 212 and the common electrodes 210 includes a triple layer of a transparent conductive layer "TL," an opaque metal layer "J" on the transparent conductive layer "TL" and a metal oxide layer "OL" on the opaque metal layer "J.". The transparent conductive layer "TL" may include one of indium-tin oxide (ITO) and indium-zinc-oxide (IZO), and the metal oxide layer "OL" may be formed by an oxidation of a metallic material in a lower layer by irradiation using UV rays. For example, each of the pixel electrodes 212 and the common electrodes 210 may include a multiple layer of ITO/Ti/TiO$_2$.

In addition, a gate pad terminal 250 and a data pad terminal 252 are formed on the passivation layer 213 to contact the gate pad 208 and the data pad 209, respectively. The gate pad terminal 250 and the data pad terminal 252 include the transparent conductive layer "TL" and the opaque metal layer "J.". A blocking means such as a shadow mask shields the gate pad terminal 250 and the data pad terminal 252 during irradiation of the pixel electrodes 212 and the common electrodes 210, so that UV rays do not reach the gate pad terminal 250 and the data pad terminal 252. As a result, the metal oxide layer "OL" is formed on the opaque metal layer "J" of the pixel electrodes 212 and the common electrodes 210, while a metal oxide layer is not formed on the opaque metal layer "J" of the gate pad terminal 250 and the data pad terminal 252.

In the first and second embodiments of the present invention, because the opaque metal layer of the gate pad terminal and the data pad terminal may be exposed to ambient air, the opaque metal layer may become oxidized, forming a native oxide layer on a top surface thereof. Accordingly, the gate pad terminal and the data pad terminal may include a transparent conductive layer in another embodiment as illustrated in FIGS. 12A to 12C.

Figure 12A:
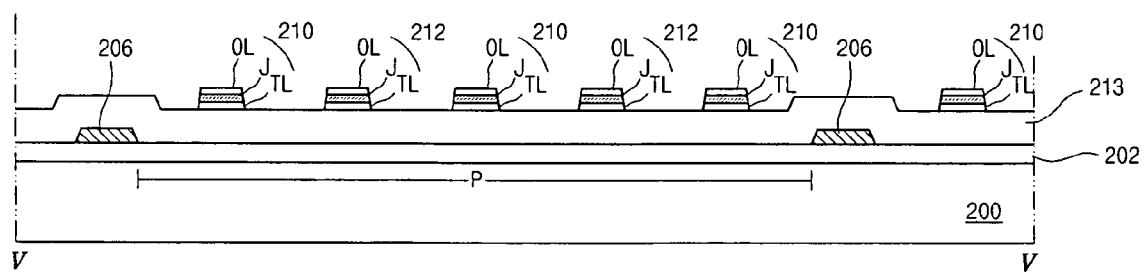
FIGS. 12A, 12B, and 12C are cross-sectional views showing an array substrate for an in-plane switching liquid crystal display device according to a third embodiment of the present invention.
Figure 12B:
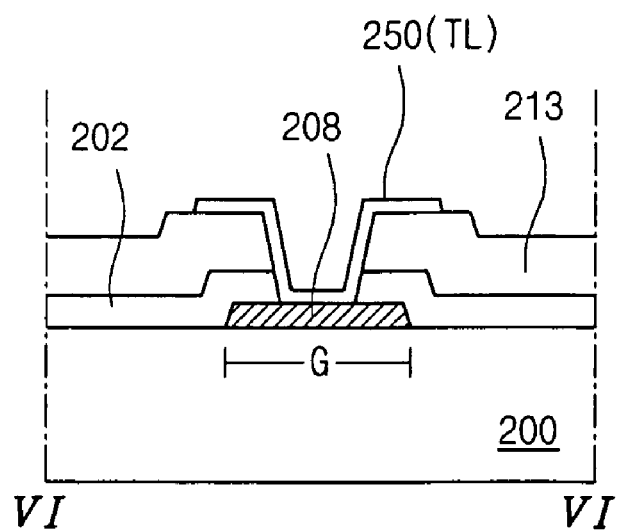
Figure 12C:
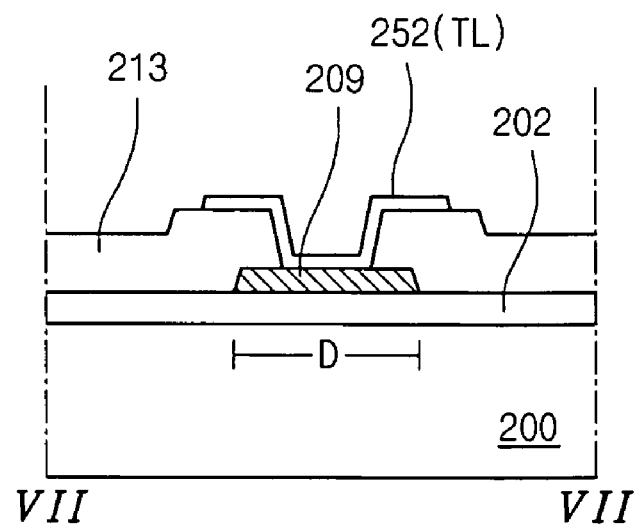

FIGS. 12A to 12C are cross-sectional views showing an array substrate for an in-plane switching liquid crystal display device according to a third embodiment of the present invention.

As illustrated in FIGS. 12A to 12C, pixel electrodes 212 and common electrodes 210 formed on a passivation layer 213 in a pixel region "P" each include a transparent conductive layer "TL," an opaque metal layer "J" and a metal oxide layer "OL." A gate pad terminal 250 in a gate pad region "G" and a data pad terminal 252 in a data pad region "D" include the transparent conductive layer "TL."

In a first method for forming the transparent conductive layer "TL" of the gate pad terminal 250 and the data pad terminal 252, a transparent conductive material layer (not shown) is formed on an entire surface of the passivation layer 213, and an opaque metallic material is deposited on the transparent conductive material layer "TL" using a blocking means such as a shadow mask . . . The blocking means may be disposed to shield the gate pad region "G" and the data pad region "D" during deposition of the opaque metallic material. Accordingly, while a transparent conductive material layer and an opaque metallic material layer (not shown) are formed on the passivation layer 213 in the pixel region "P," the transparent conductive material layer is formed on the passivation layer 213 in the gate pad region "G" and the data pad region "D," and the opaque metallic layer is not formed in the gate pad region "G" and the data pad region "D.". The opaque metallic material layer and the transparent conductive material layer are sequentially etched through a photolithographic process using a photo mask. As a result, the pixel electrodes 212 and the common electrodes 210 having the transparent conductive layer "TL" and the opaque metal layer "J" are formed on the passivation layer 213 in the pixel region "P," while the gate pad terminal 250 and the data pad terminal 252 having the transparent conductive layer "TL" are formed on the passivation layer 213 in the gate pad region "G" and the data pad region "D." Next, UV rays are irradiated onto the pixel electrodes 212, the common electrodes 210, the gate pad terminal 250 and the data pad terminal 252. Since the transparent conductive layer "TL" is not oxidized by the UV layer, the metal oxide layer "OL" is formed on the opaque metal layer "J" of the pixel electrodes 212 and the common electrodes 210, while the transparent conductive layer "TL" of the gate pad terminal 250 and the data pad terminal 252 remains exposed (i.e. not covered by a metal oxide layer).

In an alternate method for forming the transparent conductive layer "TL" of the gate pad terminal 250 and the data pad terminal 252, a transparent conductive material layer (not shown) and an opaque metallic material layer (not shown) are sequentially formed on a passivation layer 213. Pixel electrodes 212, common electrodes 210, a gate pad terminal 250 and a data pad terminal 252 having a transparent conductive layer "TL" and an opaque metal layer "J" are formed by sequentially etching the opaque metal layer and the transparent conductive material layer. Next, the pixel electrodes 212 and the common electrodes 210 in a pixel region "P" are partially shielded through a photolithographic process, and the opaque metal layer of the gate pad terminal 250 and the data pad terminal 252 is selectively removed. For example, the opaque metal layer may be removed using an etching solution having a relatively high selectivity for the opaque metallic material over the transparent conductive material. As a result, the pixel electrodes 212 and the common electrodes 210 are formed to have the transparent conductive layer "TL" and the opaque metal layer "J," while the gate pad terminal 250 and the data pad terminal 252 are formed to have the transparent conductive layer "TL", but not the opaque metal layer "J.". Next, UV rays are irradiated onto the pixel electrodes 212, the common electrodes 210, the gate pad terminal 250 and the data pad terminal 252. Since the transparent conductive layer "TL" is not oxidized by the UV layer, the metal oxide layer "OL" is formed on the opaque metal layer "J" of the pixel electrodes 212 and the common electrodes 210, and the transparent conductive layer "TL" of the gate pad terminal 250 and the data pad terminal 252 is exposed (i.e. not covered by a metal oxide layer).

In the third embodiment of the present invention, the UV rays may be irradiated during a cleaning step. Since the UV ray irradiation is used for removing organic particles, the metal oxide layer "OL" of the pixel electrodes 212 and the common electrodes 210 is formed without an additional UV ray irradiation step. Furthermore, the opaque metal layer "J" has a relatively low resistivity and the metal oxide layer "OL" has a reflectance less than about 10%. In addition, a total thickness of the metal oxide layer "OL" and the opaque metal layer "J" is within a range of about 100 Å to about 2000 Å. As a result, a step difference associated with the pixel electrodes 212 and the common electrodes 210 is reduced. Because the gate pad terminal 250 and the data pad terminal 252 include the transparent conductive layer "TL," a metal oxide layer is not formed on the gate pad terminal 250 and the data pad terminal 252 during UV irradiation.

Although the pixel electrodes 212 and the common electrodes 210 have been described to be formed on a common layer in the third embodiment, alternately the pixel electrodes 212 may be formed on a different layer from the common electrodes 210. For example, the common electrodes 210 may be formed on the same layer as the common line.

Consequently, an IPS-LCD device of the present invention has a number of advantages. First, since the pixel electrode and the common electrode include an opaque metallic material, a chuck stain is prevented and a display quality is improved. Secondly, since one of the pixel electrode and the common electrode are formed on a different layer from one of the gate line and the data line, a thickness of the pixel electrode and the common electrode can be reduced. As a result, a step difference is reduced and a step stain is prevented, improving display quality. Thirdly, since a surface reflectance of the pixel electrode and the common electrode is less than about 10%, the darkness of a black image increases, improving a contrast ratio of the display. Fourthly, since a metal oxide of the pixel electrode and the common electrode is formed through UV ray irradiation, a fabrication process is simplified.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method of an array substrate for an in-plane switching liquid crystal display device, comprising:

forming a gate line and a common line on a substrate, the common line spaced apart from the gate line;

forming a data line crossing the gate line to define a pixel region;

forming a thin film transistor connected to the gate line and the data line;

forming a pixel electrode and a common electrode in the pixel region, each of the pixel electrode and the common electrode including an opaque metal layer;

forming a gate pad at one end of the gate line;

forming a data pad at one end of the data line;

forming a gate pad terminal contacting the gate pad and a data pad terminal contacting the data pad;

disposing a blocking means directly over the gate pad terminal and the data pad terminal; and forming a metal oxide layer on the opaque metal layer of the pixel and common electrodes by irradiating ultraviolet rays onto the opaque metal layer after disposing the blocking means.

2. The method according to claim 1, wherein a total thickness of the opaque metal layer and the metal oxide layer is within a range of about 100 Å to about 2000 Å.

3. The method according to claim 1, wherein each of the gate pad terminal and the data pad terminal includes the opaque metal layer.

4. A fabricating method of an array substrate for an in-plane switching liquid crystal display device, comprising:

forming a gate line and a common line on a substrate, the common line spaced apart from the gate line;

forming a data line crossing the gate line to define a pixel region;

forming a thin film transistor connected to the gate line and the data line;

forming a pixel electrode and a common electrode in the pixel region, each of the pixel electrode and the common electrode including a transparent conductive layer and an opaque metal layer on the transparent conductive layer;

forming a gate pad at one end of the gate line;

forming a data pad at one end of the data line;

forming a gate pad terminal contacting the gate pad and a data pad terminal contacting the data pad;

disposing a blocking means directly over the gate pad terminal and the data pad terminal; and forming a metal oxide layer on the opaque metal layer of the pixel and common electrodes by irradiating ultraviolet rays onto the opaque metal layer after disposing the blocking means.

5. The method according to claim 4, wherein a total thickness of the transparent conductive layer, the opaque metal layer and the metal oxide layer is within a range of about 100 Å to about 2000 Å.

6. The method according to claim 4, wherein each of the gate pad terminal and the data pad terminal includes the transparent conductive layer and the opaque metal layer.

7. A fabricating method of an array substrate for an in-plane switching liquid crystal display device, comprising:

forming a gate line and a common line on a substrate, the common line spaced apart from the gate line;

forming a data line crossing the gate line to define a pixel region;

forming a thin film transistor connected to the gate line and the data line;

forming a pixel electrode and a common electrode in the pixel region, each of the pixel electrode and the common electrode including a transparent conductive layer and an opaque metal layer on the transparent conductive layer;

forming a gate pad at one end of the gate line;

forming a data pad at one end of the data line;

forming a gate pad terminal contacting the gate pad and a data pad terminal contacting the data pad; and irradiating ultraviolet rays onto the opaque metal layer to form a metal oxide layer on the opaque metal layer, wherein each of the gate pad terminal and the data pad terminal includes the transparent conductive layer, and wherein the forming the gate pad terminal and the data pad terminal comprises:

forming a transparent conductive material layer over the gate pad and the data pad;

forming an opaque metallic material layer on the transparent conductive material layer using a blocking means disposed over the gate pad and the data pad; and sequentially etching the opaque metallic material layer and the transparent conductive material layer to form the gate pad terminal and the data pad terminal.

8. A fabricating method of an array substrate for an in-plane switching liquid crystal display device, comprising:

forming a gate line and a common line on a substrate, the common line spaced apart from the gate line;

forming a data line crossing the gate line to define a pixel region;

forming a thin film transistor connected to the gate line and the data line;

forming a pixel electrode and a common electrode in the pixel region, each of the pixel electrode and the common electrode including a transparent conductive layer and an opaque metal layer on the transparent conductive layer;

forming a gate pad at one end of the gate line;

forming a data pad at one end of the data line;

forming a gate pad terminal contacting the gate pad and a data pad terminal contacting the data pad; and irradiating ultraviolet rays onto the opaque metal layer to form a metal oxide layer on the opaque metal layer, wherein each of the gate pad terminal and the data pad terminal includes the transparent conductive layer, and wherein the forming the gate pad terminal and the data pad terminal comprises:

sequentially forming a transparent conductive material layer and an opaque metallic material layer over the gate pad and the data pad;

sequentially etching the opaque metallic material layer and the transparent conductive material layer to form the gate pad terminal and the data pad terminal; and etching the opaque metallic material layer of the gate pad terminal and the data pad terminal and the transparent conductive material layer.

* * * * *